(12) United States Patent
Kim et al.

(10) Patent No.: US 10,143,095 B2
(45) Date of Patent: Nov. 27, 2018

(54) ROLLABLE DISPLAY DEVICE WITH SEPARATE ROLLERS FOR DISPLAY AND DISPLAY WINDOW

(71) Applicant: Samsung Display Co., Ltd., Yongin-si, Gyeonggi-do (KR)

(72) Inventors: Sunho Kim, Seongnam-si (KR); Taewoong Kim, Seongnam-si (KR); Boik Park, Uiwang-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/683,307

(22) Filed: Aug. 22, 2017

(65) Prior Publication Data

US 2018/0110137 A1  Apr. 19, 2018

(30) Foreign Application Priority Data

Oct. 17, 2016 (KR) .................. 10-2016-0134555

(51) Int. Cl.
*H05K 5/00* (2006.01)
*G06F 1/16* (2006.01)
*G02F 1/1333* (2006.01)
*G02F 1/00* (2006.01)
*H01L 51/52* (2006.01)
*H01L 27/32* (2006.01)
*H05K 5/02* (2006.01)
*G06F 3/041* (2006.01)

(52) U.S. Cl.
CPC ............ *H05K 5/0017* (2013.01); *G02F 1/00* (2013.01); *G02F 1/133305* (2013.01); *G06F 1/1652* (2013.01); *G06F 3/041* (2013.01); *H01L 27/323* (2013.01); *H01L 51/5246* (2013.01); *H05K 5/0217* (2013.01); *G06F 2203/04102* (2013.01); *H01L 2251/5338* (2013.01)

(58) Field of Classification Search
CPC ................ H05K 5/0017; H05K 5/0217; G06F 2203/04102; G06F 1/1652; H01L 2251/5338; G02F 1/133305
See application file for complete search history.

(56) References Cited

U.S. PATENT DOCUMENTS

| | | | |
|---|---|---|---|
| 7,822,449 B2 | 10/2010 | Uramoto et al. | |
| 2008/0049003 A1* | 2/2008 | Hasegawa ............. | G06F 1/1615 345/206 |
| 2015/0340004 A1* | 11/2015 | Pang ........................ | G09G 5/00 345/205 |

(Continued)

FOREIGN PATENT DOCUMENTS

| | | | | |
|---|---|---|---|---|
| EP | 3115988 A1 * | 1/2017 | ............. | H05K 1/028 |
| JP | 2015-226204 A | 12/2015 | | |

(Continued)

*Primary Examiner* — Larry Lee
(74) *Attorney, Agent, or Firm* — Innovation Counsel LLP

(57) ABSTRACT

A rollable display device includes a display module, a window member, a housing in which the display module and the window member are configured to be rolled up and stored, the housing having a slot through which the display module and the window member are configured to move in and out, a first rotary member disposed inside the housing configured to roll up the display module, and a second rotary member disposed inside the housing, spaced from the first rotary member, and configured to roll up the window member.

20 Claims, 13 Drawing Sheets

(56) References Cited

U.S. PATENT DOCUMENTS

| | | | |
|---|---|---|---|
| 2016/0155965 A1* | 6/2016 | Kusuura | G06F 1/1652 361/749 |
| 2016/0161983 A1* | 6/2016 | Lee | G06F 1/1652 361/749 |
| 2017/0013726 A1* | 1/2017 | Han | H05K 1/028 |
| 2017/0031387 A1* | 2/2017 | Kim | G06F 1/1652 |
| 2017/0103735 A1* | 4/2017 | Oh | G06F 1/1626 |

FOREIGN PATENT DOCUMENTS

| | | |
|---|---|---|
| KR | 10-0309821 B1 | 9/2001 |
| KR | 10-2014-0133471 A | 11/2014 |
| KR | 10-1494760 B1 | 2/2015 |
| KR | 10-2015-0021221 A | 3/2015 |
| KR | 10-2015-0022977 A | 3/2015 |
| KR | 10-2016-0019597 A | 2/2016 |
| KR | 10-2016-0047869 A | 5/2016 |
| KR | 10-2016-0048283 A | 5/2016 |
| KR | 10-2016-0059372 A | 5/2016 |

\* cited by examiner

ROLLABLE DISPLAY DEVICE WITH SEPARATE ROLLERS FOR DISPLAY AND DISPLAY WINDOW

CROSS-REFERENCE TO RELATED APPLICATION

This U.S. non-provisional patent application claims priority under 35 U.S.C. § 119 of Korean Patent Application No. 10-2016-0134555, filed on Oct. 17, 2016, the entire contents of which are hereby incorporated by reference.

BACKGROUND

The present disclosure relates to a rollable display device, and more particularly, to a rollable display device with improved reliability owing to alleviation of stress.

A flexible display device is being developed in accordance with market demands. The flexible display device includes a curved display device fixed in a state having a specific curvature, a foldable display device which may be bent at more than a specific radius of curvature or may be folded around a folding axis, and a rollable display device which may be rolled up at a specific radius of curvature. A lot of research has been carried out for the rollable display device among the aforementioned, because the rollable display device has a feature of providing excellent portability compared with a display area.

SUMMARY

The present disclosure provides a rollable display device with improved reliability owing to alleviation of stress.

An embodiment of the present disclosure provides a rollable display device including a display module having a first module surface and a second module surface opposed to the first module surface, a window member disposed on the first module surface and having a first window surface and a second window surface opposed to the first window surface and disposed between the first window surface and the first module surface, a housing in which the display module and the window member are configured to be rolled up and stored, the housing having a slot through which the display module and the window member are configured to move in and out, a first rotary member disposed inside the housing to roll up the display module, and a second rotary member disposed inside the housing spaced from the first rotary member, and configured to roll up the window member.

In an embodiment, the display module may include a display panel configured to display an image, a touch sensing unit disposed on the display panel, a first elastic layer disposed on the touch sensing unit and a second elastic layer disposed under the display panel.

In an embodiment, the display module may further include a first adhesive layer disposed between the touch sensing unit and the first elastic layer and a second adhesive layer disposed between the display panel and the second elastic layer.

In an embodiment, the first and second elastic layers may include at least one of thermoplastic polyurethane (TPU), polyurethane (PU), polydimethylsiloxane (PDMS), or polyamide (PA).

In an embodiment, the window member may include a plastic film and a hard coating layer disposed on the plastic film.

In an embodiment, the window member may include a glass substrate and a shatterproof layer disposed under the glass substrate.

In an embodiment, the rollable display device may further include a gap pattern disposed between the second window surface and the first module surface.

In an embodiment, the gap pattern may be attached to the second window surface.

In an embodiment, the gap pattern may include a light transmitting material.

In an embodiment, the gap pattern may include a plurality of first mesh lines each extending in a first direction and arranged in a second direction intersecting the first direction, and a plurality of second mesh lines each extending in the second direction and arranged in the first direction.

In an embodiment, the gap pattern may include a plurality of lines each extending in a first direction and arranged in a second direction intersecting the first direction.

In an embodiment, the gap pattern may include a plurality of dots protruding towards the first module surface from the second window surface.

In an embodiment, each of the first and second rotary members may have a cylindrical shape, the first rotary member may have a first radius, and the second rotary member may have a second radius greater than the first radius.

In an embodiment, the first rotary member may be disposed between the second rotary member and the slot of the housing, the first rotary member may contact the second module surface to roll up the display module, and the second rotary member may contact the second window surface to roll up the window member.

In an embodiment, the second rotary member may be disposed between the first rotary member and the slot of the housing, the first rotary member may contact the first module surface to roll up the display module, and the second rotary member may contact the first window surface to roll up the window member.

In an embodiment, each of the first and second rotary members may have a cylindrical shape, the first rotary member may have a first radius, and the second rotary member may have a second radius which is greater than the first radius.

In an embodiment, each of the first and second rotary members may have a cylindrical shape, and a first radius of the first rotary member and a second radius of the second rotary member may be equal to each other.

In an embodiment of the inventive concept, a rollable display device includes a display module including a display panel configured to display an image, a window member disposed on the display module to protect the display module, a first rotary member on which the display module is configured to be rolled up and a second rotary member spaced from the first rotary member and on which the window member is configured to be rolled up.

In an embodiment, the rollable display device may further include a gap pattern disposed between the display module and the window member to maintain a gap between the display module and the window member.

In an embodiment, the display module may further include a first elastic layer disposed between the display panel and the window member and a second elastic layer disposed under the display panel.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
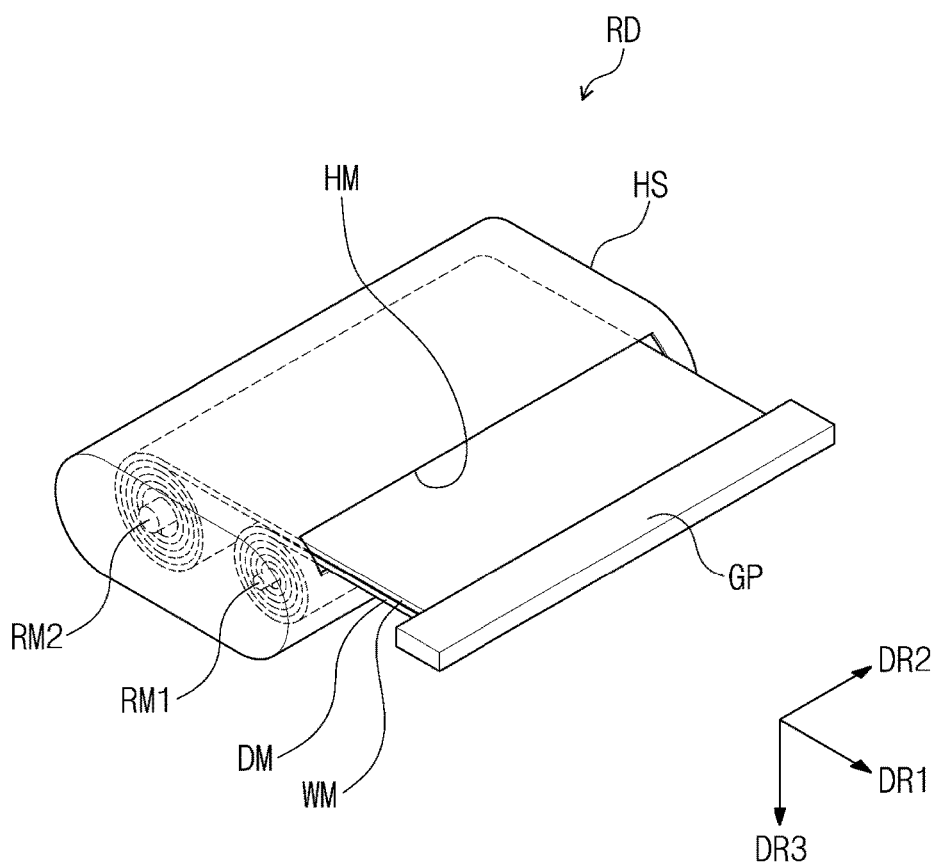
FIGS. 1 and 2 are perspective views schematically illustrating a rollable display device according to an embodiment of the inventive concept.

The embodiments according to this inventive concept may be variously modified and may have multiple forms. Thus, specific embodiments are illustrated in the drawings or described in detail in this specification or application. However, this is not intended to limit the embodiments according to the inventive concept as the specific disclosed forms; rather it should be understood that all of variations, equivalents or substitutes contained in the concept and technical scope of the inventive concept are also included.

When one element (or area, layer, part or the like) is referred to as being "on", "connected" or "coupled" to another element, it should be understood that the former may be directly on, connected or coupled to the latter, and also may be on, connected or coupled to the latter via a third intervening element.

Like reference numerals refer to like elements. Also, in the figures, the thickness, rate and dimension of elements are exaggerated for effectiveness of description of technical contents. The word "and/or" means that one or more or a combination of relevant constituent elements is possible.

Terms like a first and a second are used to describe various elements in various embodiments of the inventive concept, but the elements are not limited to these terms. These terms are used only to differentiate one element from another element. For example, the first element may be designated as the second element, and vice versa, without departing from the spirit or scope of the inventive concept. A singular form, unless otherwise indicated, includes a plural form.

Also, terms "under", "beneath", "on", "above" are used to describe relationship between elements illustrated in a drawing. These terms are relative concepts and described with reference to a direction indicated in the drawing.

The meaning of "include," "comprise," "including," or "comprising," specifies a property, a fixed number, a step, a process, an element, a component and/or a combination thereof but does not exclude other properties, fixed numbers, steps, processes, elements, components and/or combinations thereof.

Hereinafter, embodiments of the inventive concept will be described in detail with reference to the accompanying drawings.

Figure 2:
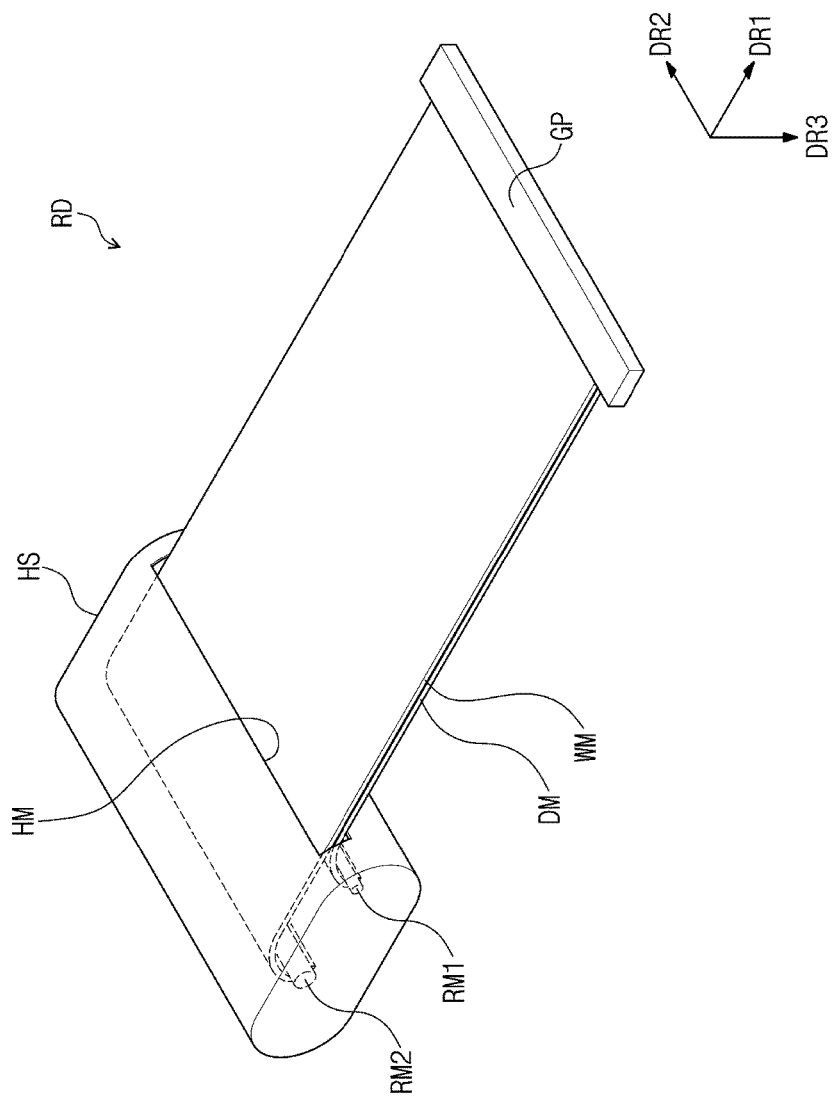

FIGS. 1 and 2 are perspective views schematically illustrating a rollable display device RD according to an embodiment of the inventive concept.

Referring to FIGS. 1 and 2, the rollable display device RD may include a display module DM, a window member WM, a housing HS, a first rotary member RM1, a second rotary member RM2, and a grip GP.

The display module DM is configured to display an image. The window member WM is disposed on the display module DM and may protect the display module DM. The display module DM and the window member WM may be rolled up to be stored inside the housing HS.

A slot HM may be defined in one area of the housing HS such that the display module DM and the window member WM move in and out therethrough. In FIG. 1, it is exemplarily illustrated that the display module DM and the window member WM move in and out through the one slot HM. However, the inventive concept is not limited thereto, and in another embodiment, a first slot allowing the display module DM to move in and out therethrough, and a second slot allowing the window member WM to move in and out therethrough may also be separately defined in the housing HS.

The first rotary member RM1 and the second rotary member RM2 may be disposed inside the housing HS. The first rotary member RM1 and the second rotary member RM2 may be spaced from each other. Each of the first and second rotary members RM1 and RM2 may have a cylindrical shape extending in a second direction DR2. Each of the first and second rotary members RM1 and RM2 may rotate in the clockwise direction or counterclockwise direction around a rotation axis extending in the second direction DR2.

The first rotary member RM1 may be coupled to the display module DM. The display module DM may be coupled to the first rotary member RM1, rolled up on the first rotary member RM1, or unrolled from the first rotary member RM1. The display module DM may also be attached to the first rotary member RM1 through an adhesive agent, or the display module DM may be coupled to the first rotary member RM1 by being fitted in a coupling slot (not illustrated) provided to the first rotary member RM1. The adhesive agent may be a separate tape for coupling the display module DM to the first rotary member RM1 or a component constituting the display module DM.

The second rotary member RM2 may be coupled to the window member WM. The window member WM may be rolled on the second rotary member RM2 or stretched out from the second rotary member RM2. The window member WM may also be attached to the second rotary member RM2 through an adhesive agent, or the window member WM may be coupled to the second rotary member RM2 by being fitted in a coupling slot (not illustrated) provided to the second rotary member RM2.

The grip GP may be coupled to the display module DM and the window member WM. A user may pull the grip GP to expose the display module DM and the window member WM to the outside. A driver chip configured to provide a driving signal to the display module DM, a printed circuit substrate, and the like may be disposed inside the grip GP.

Figure 3A:
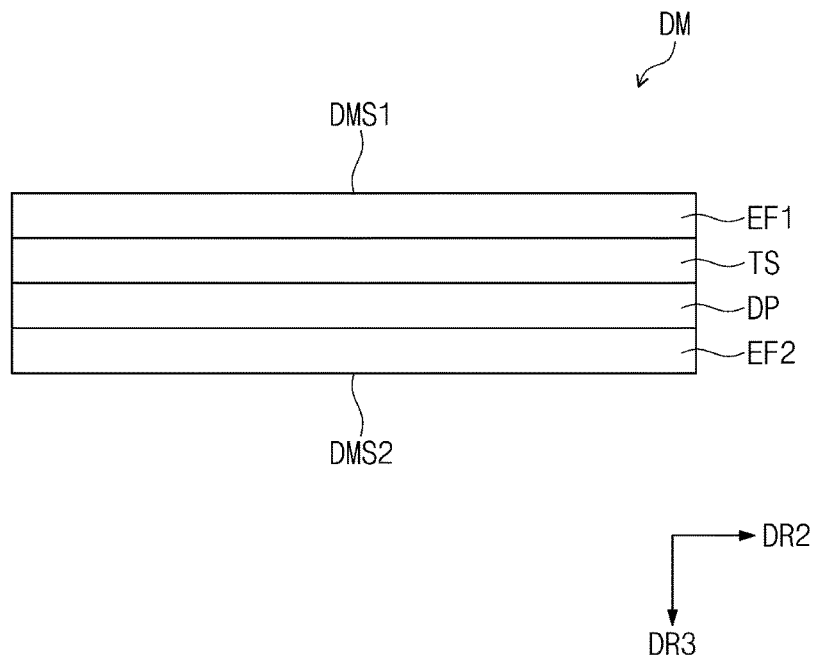
FIG. 3A is a schematic cross sectional view of a display module according to an embodiment of the inventive concept.

FIG. 3A is a schematic cross-sectional view of a display module DM according to an embodiment of the inventive concept.

The display module DM may include a display panel DP, a touch sensing unit TS, a first elastic layer EF1, and a second elastic layer EF2. The display module DM provides a first module surface DMS1 and a second module surface DMS2 that are opposed to each other in a thickness direction DR3.

The display panel DP is configured to display an image. Although not shown, the display panel DP may include a plurality of pixels, and may include a pixel area from which the plurality of pixels emit light and a non-pixel area surrounding the pixel area.

The touch sensing unit TS may be disposed on the display panel DP. The touch sensing unit TS may acquire coordinate information of an external input.

The first elastic layer EF1 is disposed on the touch sensing unit TS and the second elastic layer EF2 may be disposed under the display panel DP. The first and second elastic layers EF1 and EF2 may be composed of a material having modulus relatively lower than and ductility higher than materials of other layers constituting the display panel DP. For example, the first and second elastic layers EF1 and EF2 may include at least one of thermoplastic polyurethane (TPU), polyurethane (PU), polydimethylsiloxane (PDMS), or polyamide (PA).

When the first and second elastic layers EF1 and EF2 are disposed on both surfaces of the touch sensing unit TS and the display panel DP, shear stress acting on the touch sensing unit TS and the display panel DP and rolling stiffness due to rolling may be reduced. Consequently, probability of occurrence of buckling and cracks in the touch sensing unit TS and the display panel DP may be reduced.

The first elastic layer EF1 may be provided by being coated on one surface of the touch sensing unit TS, and the second elastic layer EF2 may be provided by being coated on one surface of the display panel DP. Since the first and second elastic layers EF1 and EF2 are provided by being coated on one surface of the touch sensing unit TS and the display panel DP, the thickness of the display module DM may be reduced.

Figure 3B:
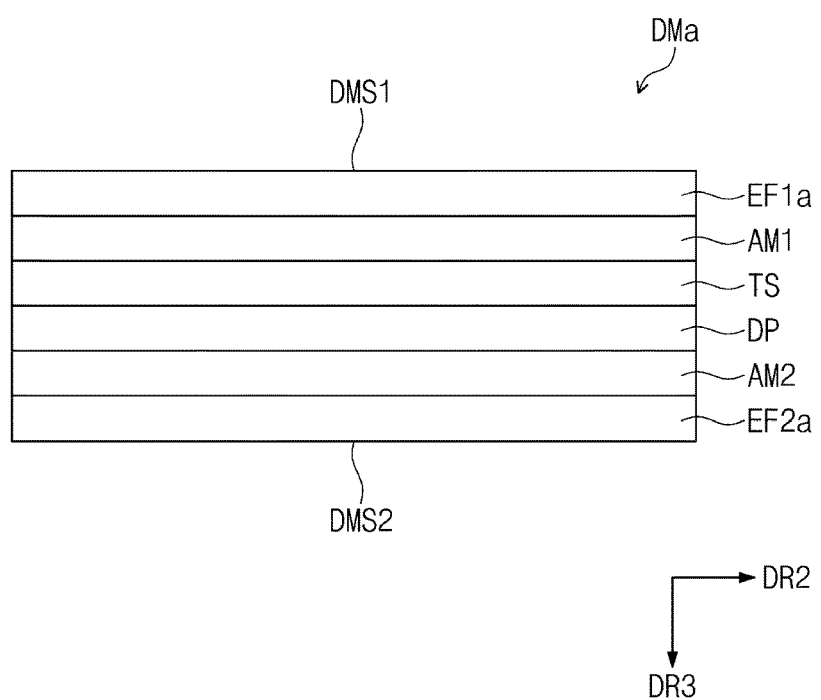
FIG. 3B is a schematic cross sectional view of a display module according to an embodiment of the inventive concept.

FIG. 3B is a schematic cross-sectional view of a display module DMa according to an embodiment of the inventive concept. In describing FIG. 3B, differences from FIG. 3A will be described, same reference numerals are given to the same elements, and duplicate description thereof will be omitted.

The display module DMa may include a display panel DP, a touch sensing unit TS, a first elastic layer EF1a, a second elastic layer EF2a, a first adhesive layer AM1, and a second adhesive layer AM2.

The first and second elastic layers EF1a and EF2a may be provided in a film type. The first and second elastic layers EF1a and EF2a may include at least any one of thermoplastic polyurethane (TPU), polyurethane (PU), polydimethylsiloxane (PDMS), or polyamide (PA).

The first adhesive layer AM1 may be disposed between the first elastic layer EF1a and the touch sensing unit TS to bond the first elastic layer EF1a and the touch sensing unit TS to each other. The second adhesive layer AM2 may be disposed between the second elastic layer EF2a and the display panel DP to bond the second elastic layer EF2a and the display panel DP to each other.

Each of the first and second adhesive layers AM1 and AM2 may be an organic adhesive layer such as an optically clear adhesive film (OCA), an optically clear resin (OCR) or a pressure sensitive adhesive film (PSA). The organic adhesive layer may include an adhesive material based on polyurethane, polyacrylic, polyester, polyepoxy, or polyvinyl acetate.

Figure 4:
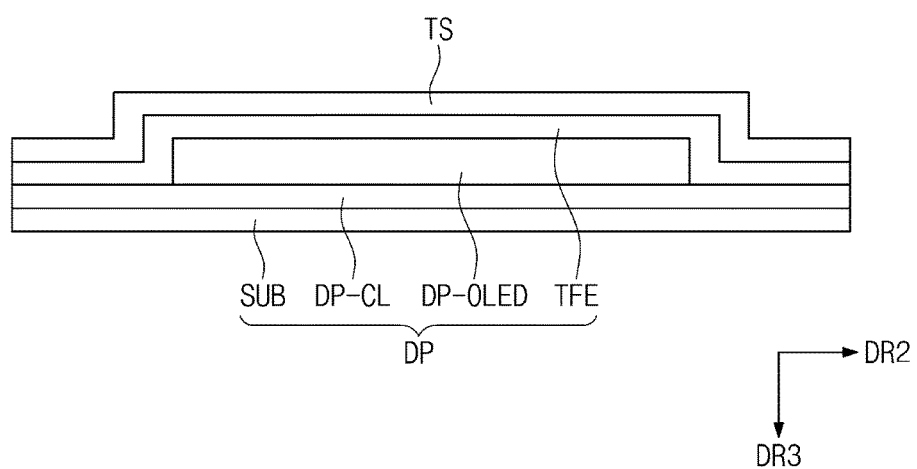
FIG. 4 is a schematic view of a display panel and a touch sensing electrode according to an embodiment of the inventive concept.

FIG. 4 is a schematic view of a display panel DP and a touch sensing unit TS according to an embodiment of the inventive concept. In FIG. 4, an organic light emitting display panel will be described as a typical example of the display panel DP. However, the inventive concept is not limited thereto.

The display panel DP includes a base layer SUB, a circuit layer DP-CL disposed on the base layer SUB, a light emitting device layer DP-OLED, and a thin film encapsulation layer TFE.

The base layer SUB may include at least one plastic film. The base layer SUB is a flexible substrate and may include a plastic substrate, a glass substrate, a metal substrate, or an organic/inorganic composite material substrate. The plastic substrate may include at least one of an acrylic resin, a methacrylic resin, polyisoprene, a vinyl resin, an epoxy resin, a urethane resin, a cellulose resin, a siloxane resin, a polyimide resin, a polyamide resin, or a perylene resin.

A circuit layer DP-CL may include a plurality of insulation layers, a plurality of conductive layers, and a semiconductor layer. The plurality of conductive layers of the circuit layer DP-CL may constitute signal lines or a pixel control circuit.

The light emitting device layer DP-OLED includes organic light emitting diodes.

The thin film encapsulation layer TFE encapsulates the light emitting device layer DP-OLED. The thin film encapsulation layer TFE includes a plurality of inorganic thin films and at least one organic thin film disposed therebetween. The inorganic thin films protect the light emitting device layer DP-OLED from moisture/oxygen, and the organic thin film protects the light emitting device layer DP-OLED from foreign materials, such as dusts.

The touch sensing unit TS includes touch sensors and touch signal lines. The touch sensors and the touch signal lines may have a single layer structure or a multi-layer structure. The touch sensors and the touch signal lines may include indium tin oxide (ITO), indium zinc oxide (IZO), zinc oxide (ZnO), indium tin zinc oxide (ITZO), PEDOT, metal nano wires, or graphene. The touch sensors and the touch signal lines may include a metal layer, for example, molybdenum (Mo), silver, titanium, copper, aluminum, or an alloy thereof. The touch sensors and the touch signal lines may have an identical layer structure or a different layer structure from each other.

The touch sensing unit TS may be directly disposed on the display panel DP. In the description, "directly disposed" excludes attachment by using a separate adhesive layer, and means forming by continuous processes. However, this is exemplary only, and the touch sensing unit TS may be disposed on the thin film encapsulation layer TFE after being formed on a film or a substrate.

Figure 5A:
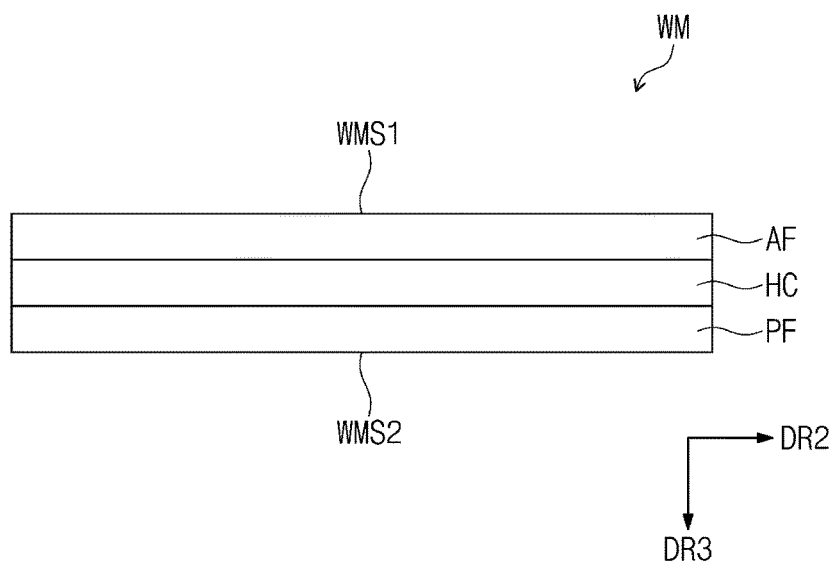
FIG. 5A is a schematic cross-sectional view of a window member according to an embodiment of the inventive concept.

FIG. 5A is a schematic cross-sectional view of a window member WM according to an embodiment of the inventive concept.

Referring to FIG. 5A, the window member WM protects the display module (DM in FIG. 1) from an external impact, and may provide an input surface to a user.

The window member WM may include a plastic film PF, a hard coating layer HC, and a functional layer AF. The window member WM provides a first window surface WMS1 and a second window surface WMS2 that are opposed to each other in a thickness direction DR3. The input surface may be the first window surface WMS1.

The plastic film PF may have a single layer structure or a multi-layer structure. The plastic film PF may include, for example, a plastic film including any one selected from a group consisting of polyethersulphone (PES), polyacrylate, polyetherimide (PEI), polyethylenenaphthalate (PEN), polyethyleneterephthalate (PET), polyphenylene sulfide (PPS), polyacrylate, polyimide (PI), polycarbonate (PC), poly (arylene ethersulfone), and a combination thereof. However, this is exemplary only, and the inventive concept is not limited thereto.

It is exemplarily illustrated that the hard coating layer HC is disposed on the plastic film PF, but the inventive concept is not limited thereto. The hard coating layer HC may also be disposed on both surfaces of the plastic film PF. The hard coating layer HC may reduce distortion of the window member WM or a delamination phenomenon of the coating layer HC under a harsh condition of high temperature or high humidity to thus improve reliability of the window member WM, and further, the hard coating layer HC may absorb an external impact.

The functional layer AF may be disposed on the hard coating layer HC. The functional layer AF may include at least one of an anti-finger coating layer, an anti-fouling coating layer, an anti-reflection coating layer, an anti-glare coating layer, or a hard-coating layer. In some cases, the functional layer AF may be omitted.

Figure 5B:
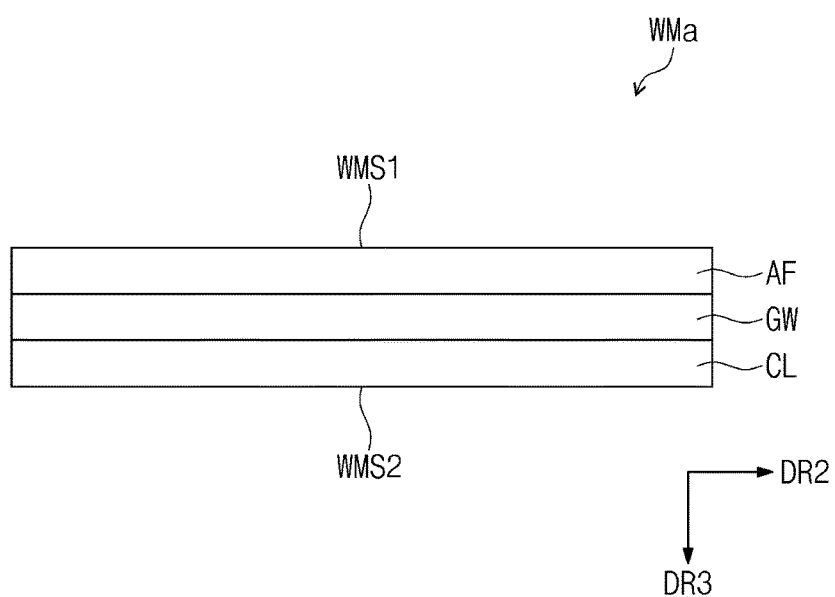
FIG. 5B is a schematic cross-sectional view of a window member according an embodiment of the inventive concept.

FIG. 5B is a schematic cross-sectional view of a window member WMa according an embodiment of the inventive concept. In describing FIG. 5B, differences from FIG. 5A are described, same reference numerals of FIG. 5A are given to the same elements of FIG. 5B, and duplicate description thereof will be omitted.

The window member WMa may include a glass substrate GW, a shatterproof layer CL, and a functional layer AF.

The glass substrate GW may be made of glass. The glass substrate GW may have flexibility by adjusting the thickness of glass or through chemical strengthening. The use of the glass substrate GW may reduce a phenomenon in which color of the window member WMa is changed, or transparency of the window member WMa is degraded.

The shatterproof layer CL may be disposed under the glass substrate GW. The shatterproof layer CL may be directly applied on a lower surface of the glass substrate GW, or the shatterproof layer CL may be provided in a film type to be attached to the lower surface of the glass substrate GW through an adhesive. If and when the glass substrate GW is broken, the shatterproof layer CL may prevent fragments of the glass substrate GW from scattering.

The shatterproof layer CL may be composed of a polymeric resin, and may have optical transparency. In FIG. 5B, it is exemplarily illustrated that the shatterproof layer CL is provided in a single layer, but the inventive concept is not limited thereto, and in another embodiment, the shatterproof layer CL may be provided in a plurality of layers.

Figure 6:
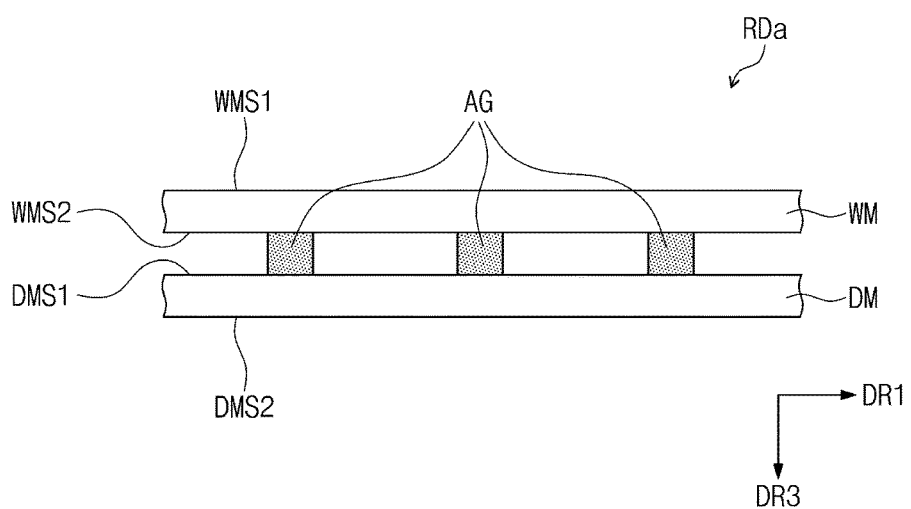
FIG. 6 is a cross-sectional view of a portion of a rollable display device according to an embodiment of the inventive concept.

FIG. 6 is a cross-sectional view of a portion of a rollable display device RDa according to an embodiment of the inventive concept.

Referring to FIG. 6, the rollable display device RDa may further include a gap pattern AG. The gap pattern AG may be disposed between a window member WM and a display module DM.

The gap pattern AG may be attached to a second window surface WMS2 of the window member WM. The gap pattern AG is provided to the window member WM, and may be rolled up on a second rotary member (RM2 of FIG. 1) together with the window member WM.

The gap pattern AG may be formed on the second window surface WMS2 of the window member WM by a photoresist process or an imprint process. The gap pattern AG may include a light transmitting material, and any material may be limitlessly used for the gap pattern AG as long as the material has optical transparency.

The gap pattern AG may enable the window member WM and the display module DM to maintain a predetermined gap therebetween. The thickness of the gap pattern AG may be 1 μm to 1000 μm. However, this is exemplary only, and the thickness of the gap pattern AG is not limited thereto. The thickness of the gap pattern AG refers to the length measured in a thickness direction DR3.

When an external impact occurs, the damage acting on the display module DM may be mitigated by the window member WM, the gap pattern AG, and an air gap created by the gap pattern AG between the window member WM and the display module DM.

Figure 7A:
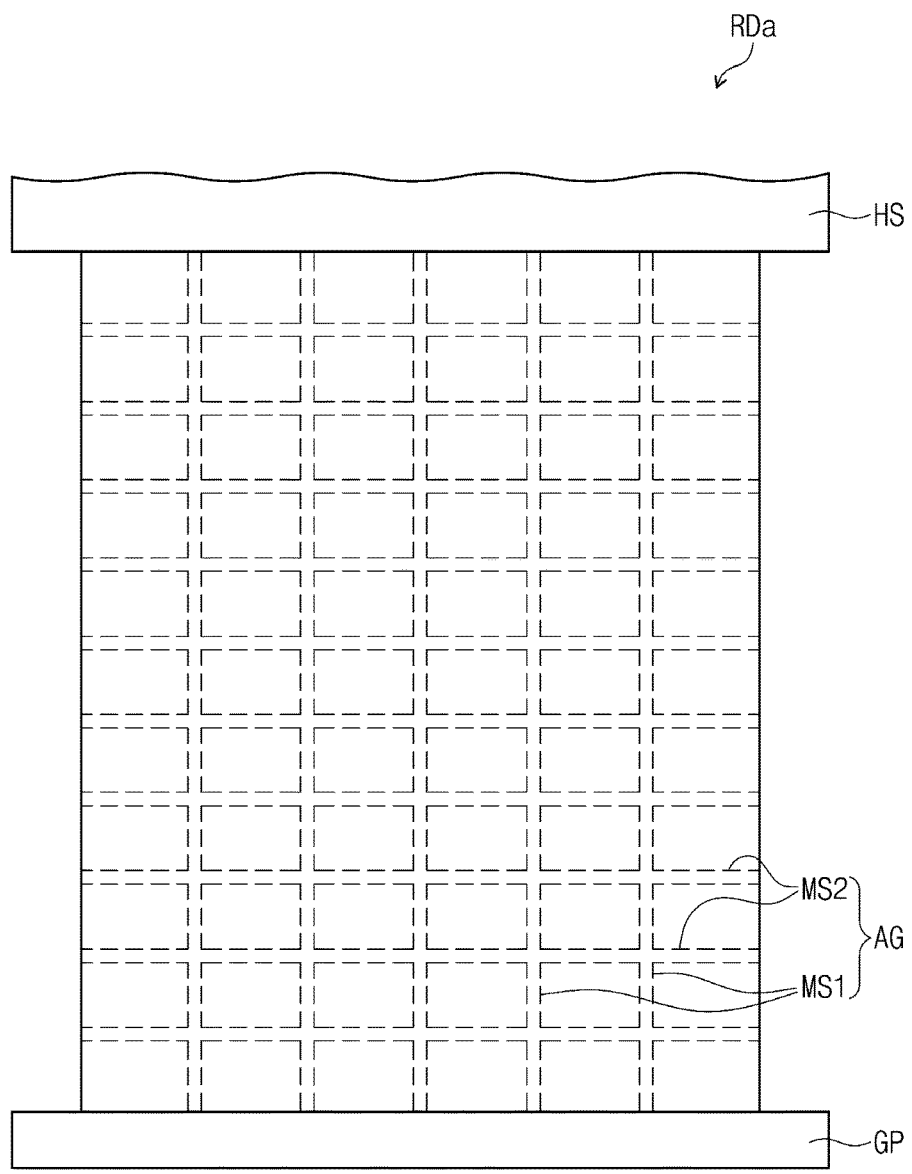
FIG. 7A is a plane view of a portion of a rollable display device according to an embodiment.

FIG. 7A is a plane view of a portion of a rollable display device RDa according to an embodiment of the inventive concept.

A gap pattern AG may include first mesh lines MS1 and second mesh lines MS2. The first mesh lines MS1 extend in a first direction DR1 and are arranged along a second direction DR2. The second mesh lines MS2 extend in the second direction DR2 and are arranged along the first direction DR1. The first and second mesh lines MS1 and MS2 may be formed at the same time through an imprint process or a photoresist process.

Figure 7B:
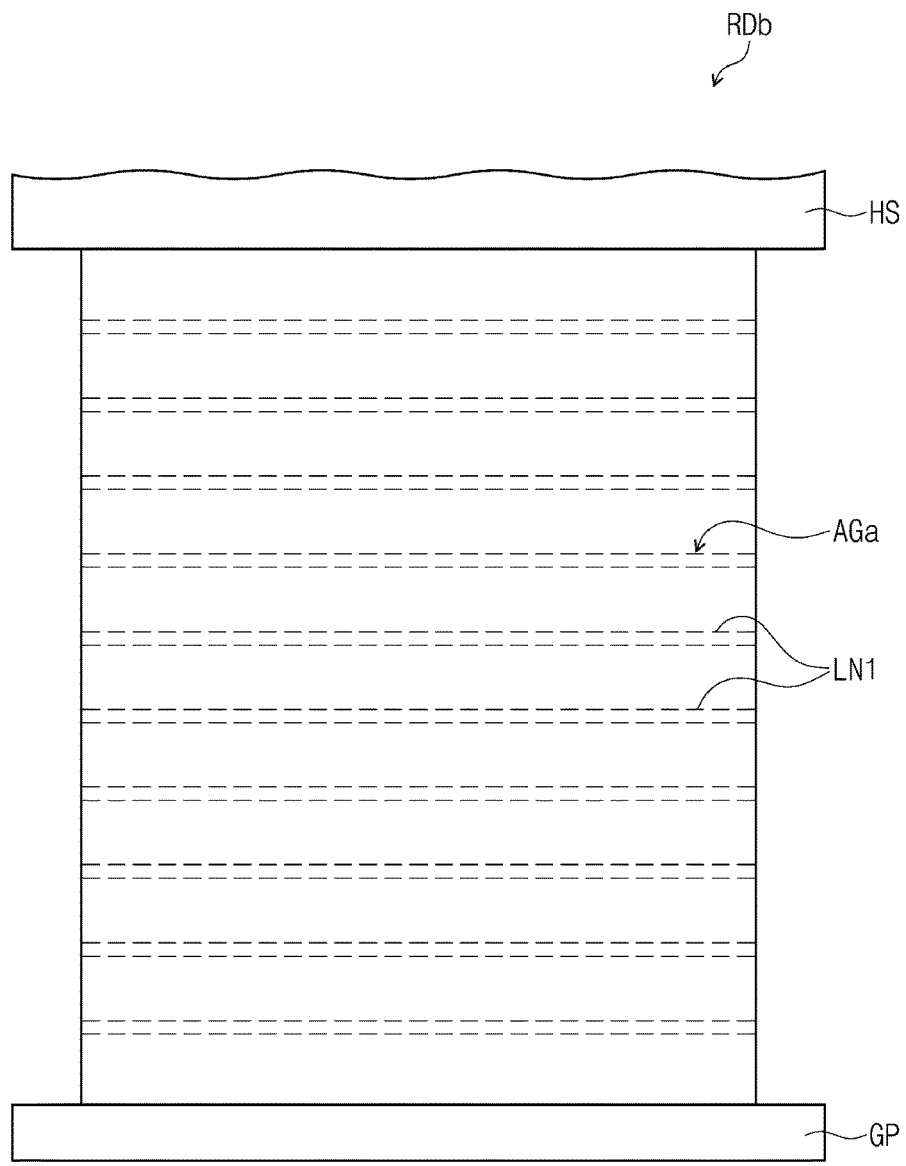
FIG. 7B is a plane view of a portion of a rollable display device according to an embodiment of the inventive concept.

FIG. 7B is a plane view of a portion of a rollable display device RDb according to an embodiment of the inventive concept.

A gap pattern AGa may include a plurality of lines LN1 extending in a second direction DR2. The plurality of lines LN1 may be arranged in a first direction DR1. The gap AGa may include a light transmitting material, and any material may be limitlessly used for the gap pattern AGa as long as the material optical transparency.

Figure 7C:
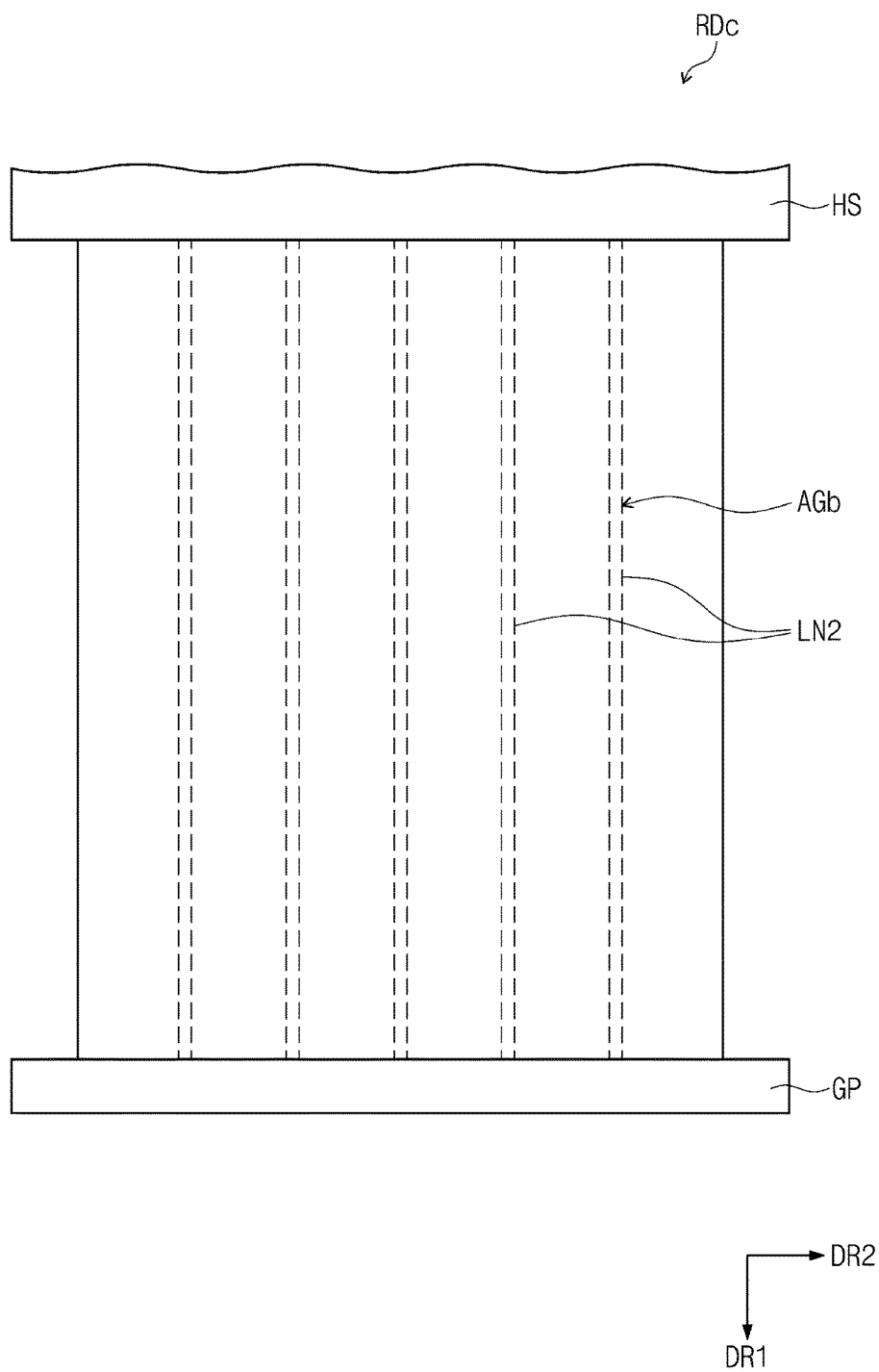
FIG. 7C is a plane view of a portion of a rollable display device according to an embodiment of the inventive concept.

FIG. 7C is a plane view of a portion of a rollable display device RDc according to an embodiment of the inventive concept.

A gap pattern AGb may include a plurality of lines LN2 each extending in a first direction DR1. The plurality of lines LN2 may be arranged in a second direction DR2. The gap pattern AGb may include a light transmitting material, and any material may be limitlessly used of the gap pattern AGb as long as the material has optical transparency.

Figure 7D:
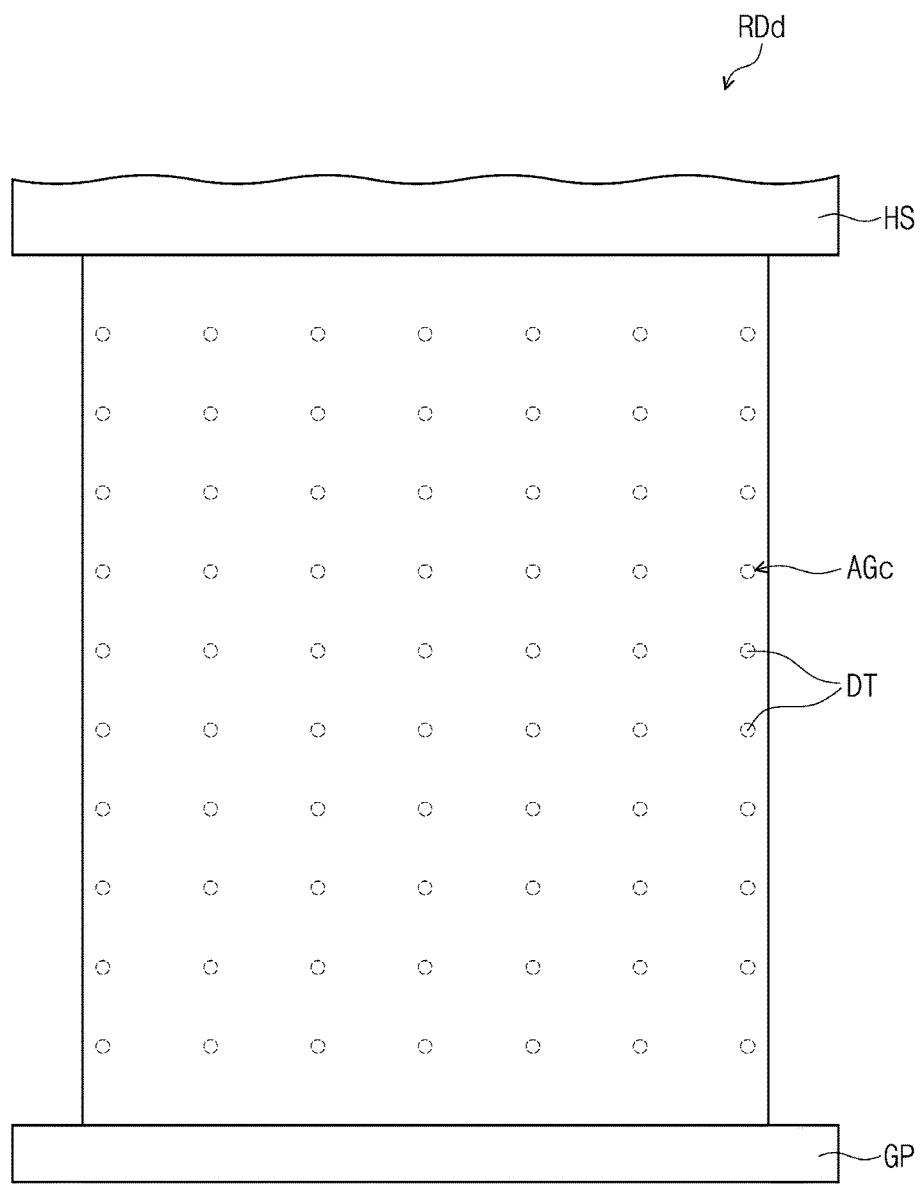
FIG. 7D is a plane view of a portion of a rollable display device according to an embodiment of the inventive concept.

FIG. 7D is a plane view of a portion of a rollable display device RDd according to an embodiment of the inventive concept.

A gap pattern AGc may be composed of a plurality of dots DT. Each of the plurality of dots DT may have a shape protruding from a second window surface WMS2 (see FIG. 6) towards a first module surface DMS1 (see FIG. 6). Each of the plurality of dots DT may have a semi-spherical shape, or a cylindrical shape. However, this is exemplary only, and the plurality of dots DT may be modified in various shapes.

The plurality of dots DT may be arranged in a matrix shape along the first and second directions DR1 and DR2. However, this is exemplary only, and the plurality of dots DT may be irregularly arranged. When a window member WM (see FIG. 1) and a display module DM (see FIG. 1) are exposed from a housing HS (see FIG. 1), it is preferable that the plurality of dots DT and the pixel area inside the display module DM do not overlap each other.

Figure 8A:
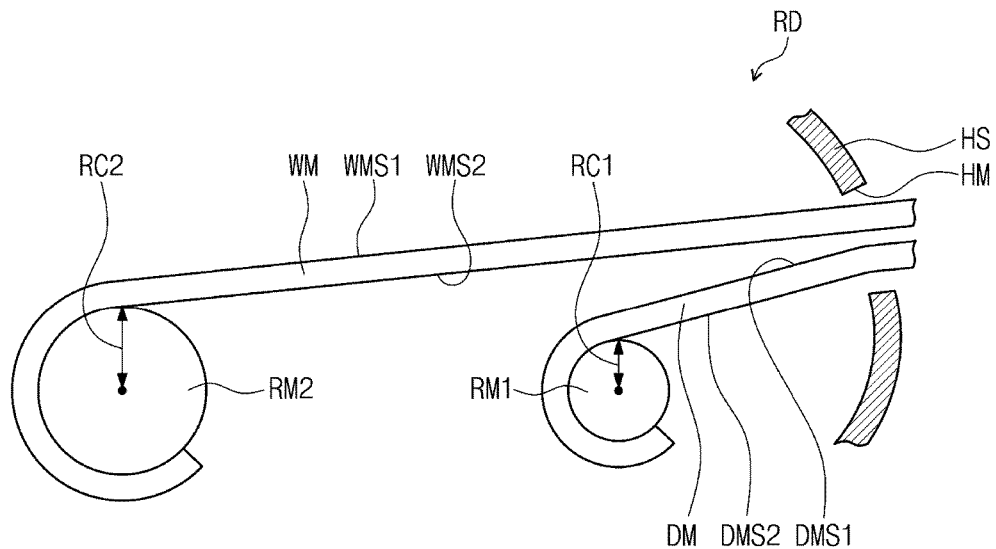
FIG. 8A is a cross-sectional view of a portion of a rollable display device according to an embodiment of the inventive concept.

FIG. 8A is a cross-sectional view of a portion of a rollable display device RD according to an embodiment of the inventive concept.

Referring to FIG. 8A, a portion inside a housing HS is illustrated. A display module DM may be rolled up or unrolled by a first rotary member RM1, a window member WM may be rolled up or unrolled by a second rotary member RM2. The display module DM and the window member WM may be exposed to the outside of the housing HS through a slot HM defined in the housing HS.

The first rotary member RM1 may contact a second module surface DMS2 of the display module DM to roll up the display module DM, and the second rotary module RM2 may contact a second window surface WMS2 of the window member WM to roll up the window member WM. The first rotary member RM1 may be disposed between the second rotary member RM2 and the slot HM of the housing HS. That is, the first rotary member RM1 may be closer to the slot HM than the second rotary member RM2.

The first rotary member RM1 may have a first radius RC1, and the second rotary member RM2 may have a second radius RC2. The window member WM has properties of protecting the display module DM, so the window member WM may be harder than the display module DM. That is, the display module DM may be more flexible than the window member WM, and also, the display module DM may be easily rolled up on a rotary member having less radius of curvature. Thus, the second radius RC2 may be greater than the first radius RC1.

Since the first radius RC1 and the second radius RC2 are different from each other in this embodiment, rotation speed of the first rotary member RM1 and the second rotary member RM2 may be different from each other.

Figure 8B:
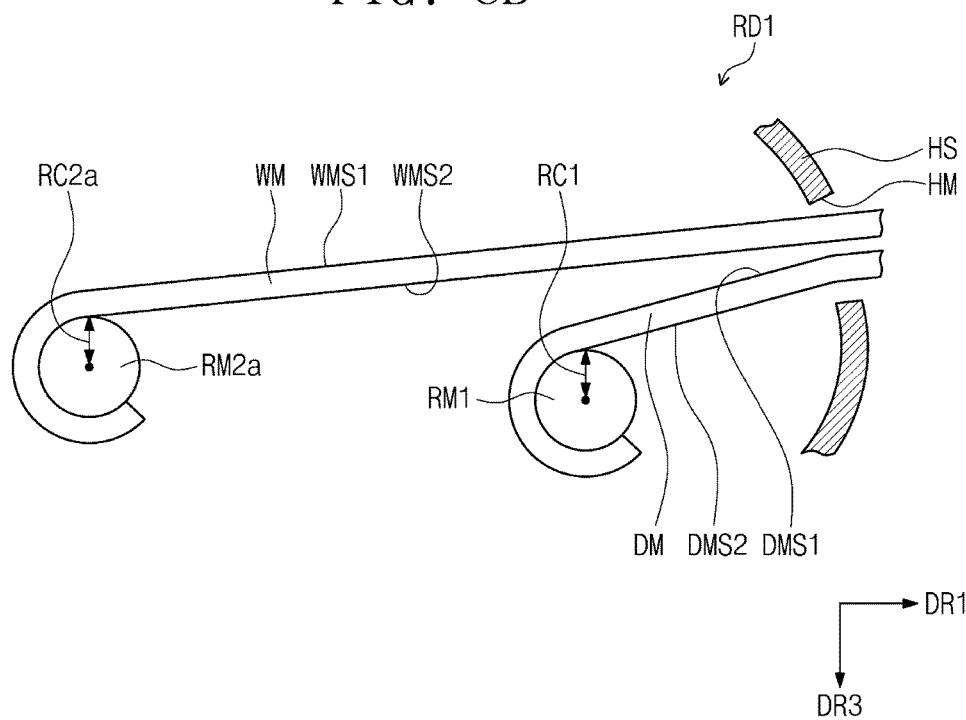
FIG. 8B is a cross-sectional view of a portion of a rollable display device according to an embodiment of the inventive concept.

FIG. 8B is a cross-sectional view of a portion of a rollable display device RD1 according to an embodiment of the inventive concept.

Referring to FIG. 8B, a second rotary member RM2a is different when compared to FIG. 8A. A second radius RC2a of the second rotary member RM2a may be the same as the first radius RC1 of the first rotary member RM1. Since the first radius RC1 and the second radius RC2a are same to each other, the rotation speed of the first rotary member RM1 and the second rotary member RM2a may be the equal to each other.

Figure 8C:
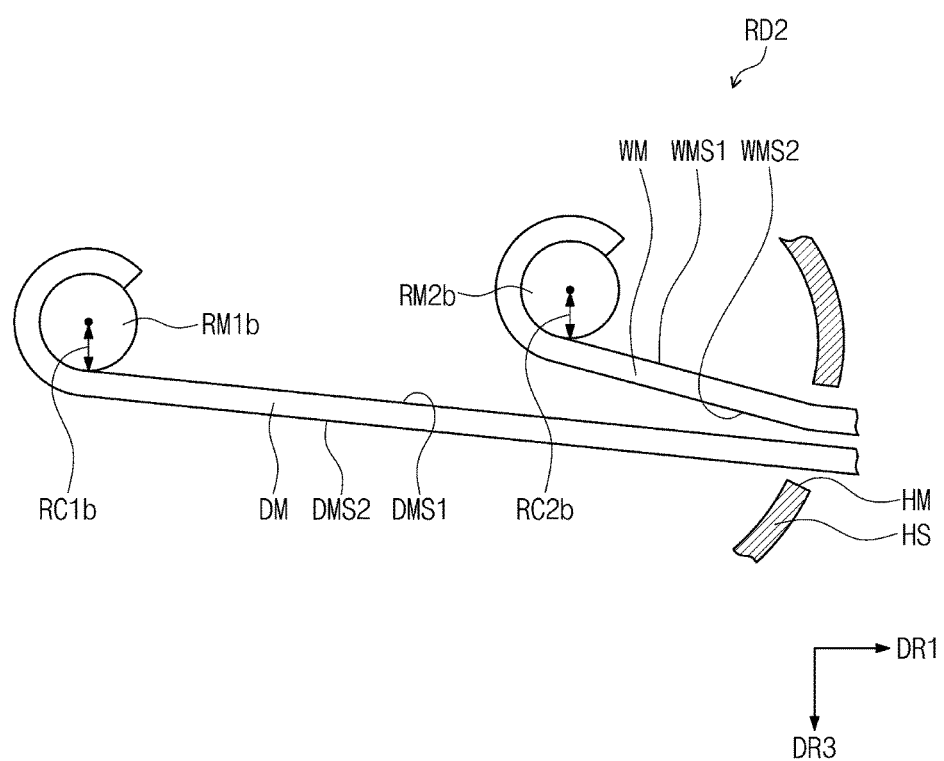
FIG. 8C is a cross-sectional view of a portion of a rollable display device according to an embodiment of the inventive concept.

FIG. 8C is a cross-sectional view of a portion of a rollable display device RD2 according to an embodiment of the inventive concept.

Referring to FIG. 8C, a first rotary member RM1b may contact a first module surface DMS1 of a display module DM to roll up the display module DM, and a second rotary member RM2b may contact a first window surface WMS1 of a window member WM to roll up the widow member WM. The second rotary member RM2b may be disposed between the first rotary member RM1b and a slot HM of a housing HS. That is, the second rotary member RM2b may be closer to the slot HM than the first rotary member RM1b.

Given that each of the first rotary members RM1 of FIGS. 8A and 8B is an out-rolling type in which the first rotary member RM1 contacts the second module surface DMS2 of the display module to roll up the display module DM, the first rotary member RM1b of FIG. 8C may be an in-rolling type in which the first rotary member RM1b contacts the first module surface DMS1 of the display module DM to roll up the display module DM. Further, given that each of the second rotary members RM2 and RM2a of FIGS. 8A and 8B is the out-rolling type in which each of the second rotary members RM2 and RM2a contacts the second window surface WMS2 of the window member WM to roll up the window member WM, the second rotary member RM2b of FIG. 8C may be the in-rolling type in which the second rotary member RM2b contacts the first window surface WMS1 of the window member WM to roll up the window member WM.

In FIG. 8C, it is illustrated as an example that the second radius RC2b of the second rotary member RM2b is equal to the first radius RC1b of the first rotary member RM1b, but the inventive concept is not limited thereto, and in another embodiment, the first radius RC1b may be less than the second radius RC2b as aforementioned with reference to FIG. 8A.

Figure 9:
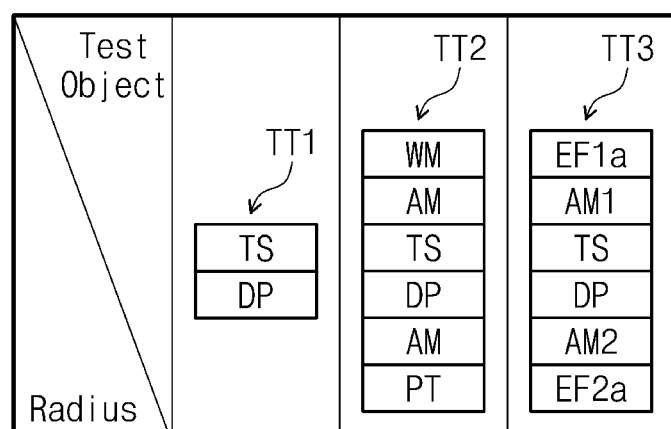
FIG. 9 is a test table exhibiting whether buckling and cracking occur in test objects when the test objects are rolled up on rotary members with different radii.

FIG. 9 is a test table exhibiting whether buckling and cracking occur in test objects when the test objects are rolled up on rotary members with different radii.

Referring to FIG. 9, a test was performed to identify occurrence of buckling and cracking in three test objects with rotary members having different radii.

A first test object TT1 is a display module including a display panel DP and a touch sensing unit TS. A second test object TT2 is a display module including a display panel DP, a touch sensing unit TS, a window member WM, adhesive layers AM, and a protection layer PT. A third test object TT3 is the display module DMa illustrated in FIG. 3B (see FIG. 3B).

Radii R1 to R20 illustrated in FIG. 9 refer to the aforementioned radii of the rotary members. For example, the radius may refer to the first radius RC1 (see FIG. 8A) of the first rotary member RM1 (see FIG. 8A). R1 means the radius being 1 mm, R2 means the radius being 2 mm, and R20 means the radius being 20 mm. R3 to R19 may be understood in the same manner although explanations thereof are not provided.

In the table of FIG. 9, it is shown that "O" is the case in which buckling and cracking did not occur, and "X" is the case in which buckling and cracking occurred. The test was carried out to test whether buckling and cracking occur or not when each of the first to third test objects TT1 to TT3 is rolled up on the rotary member once.

For example, buckling may occur from delamination of the thin film encapsulation layer TFE (see FIG. 4) of the display panel DP. However, this is merely an example of occurrence of buckling, and the cause of buckling is not limited thereto. For example, the buckling phenomenon may also occur from the protection layer PT of the second test object TT2.

When the first and third test objects TT1 and TT3 not including a window member were rolled up on a rotary member, buckling and cracking did not occur when the first and third test objects TT1 and TT3 were rolled up on a rotary member having a radius of 2 mm. Buckling and cracking did occur when the first test object TT1 was rolled up on a rotary member having a radius of 1 mm. Particularly, in the case of the third test object TT3 which includes the first and second elastic layers EF1a and EF2a further added to the first test object TT1, buckling and cracking did not occur even when the third test object TT3 was rolled up on a rotary member having a radius 1 mm.

However, in the case of the second test object TT2 having a window member combined thereto, buckling and cracking did not occur when the second test object TT2 was rolled up on a rotary member having a radius of 6 mm, but buckling and cracking occurred when the second test object TT2 was rolled up on a rotary member having a radius of 5 mm. That is, when only a display module is rolled up on one rotary member and a window member is rolled up on another rotary member, the display module may be rolled up on a rotary member having less radius of curvature.

Further, even when the first to third test objects TT1 to TT3 are rolled up on rotary members having the same radius of curvature, probability of occurrence of buckling and cracking may be lower in the case in which only the display module (for example, the first and third test objects) is rolled up on a rotary member than the case in which the window member and the display module are rolled up on the same rotary member (for example, the second test object).

According to an embodiment of the inventive concept, a window and a display module of a rollable display device are rolled up on rotary members different from each other. The probability of occurrence of buckling and cracking in this case may be lower than the case in which the window and the display module are rolled up on the same rotary member, so that reliability of the rollable display device may be improved.

While the inventive concept has been particularly shown and described with reference to exemplary embodiments thereof, it will be understood by those of ordinary skilled in the art that various changes may be made therein without departing from the scope of the inventive concept as defined by the following claims. Therefore, technical scope of the inventive concept should not be construed as limited to those described in the description, but determined by the appended claims.

What is claimed is:

1. A rollable display device comprising:
   a display module having a first module surface and a second module surface opposed to the first module surface;
   a window member disposed on the first module surface and having a first window surface and a second window surface opposed to the first window surface and disposed between the first window surface and the first module surface;
   a housing in which the display module and the window member are configured to be rolled up and stored, the housing having a slot through which the display module and the window member are configured to move in and out;
   a first rotary member disposed inside the housing configured to roll up the display module; and
   a second rotary member disposed inside the housing, spaced from the first rotary member, and configured to roll up the window member.

2. The rollable display device of claim 1, wherein the display module comprises:
   a display panel configured to display an image;
   a touch sensing unit disposed on the display panel;
   a first elastic layer disposed on the touch sensing unit; and
   a second elastic layer disposed under the display panel.

3. The rollable display device of claim 2, wherein the display module further comprises:
   a first adhesive layer disposed between the touch sensing unit and the first elastic layer; and
   a second adhesive layer disposed between the display panel and the second elastic layer.

4. The rollable display device of claim 2, wherein the first and second elastic layers each comprise at least one of thermoplastic polyurethane (TPU), polyurethane (PU), polydimethylsiloxane (PDMS), or polyamide (PA).

5. The rollable display device of claim 1, the window member comprises:
   a plastic film; and
   a hard coating layer disposed on the plastic film.

6. The rollable display device of claim 1, wherein the window member comprises:
   a glass substrate; and
   a shatterproof layer disposed under the glass substrate.

7. The rollable display device of claim 1, further comprising a gap pattern disposed between the second window surface and the first module surface.

8. The rollable display device of claim 7, wherein the gap pattern is attached to the second window surface.

9. The rollable display device of claim 7, wherein the gap pattern comprises a light transmitting material.

10. The rollable display device of claim 7, wherein the gap pattern comprises a plurality of first mesh lines each extending in a first direction and arranged in a second direction intersecting the first direction, and a plurality of second mesh lines each extending in the second direction and arranged in the first direction.

11. The rollable display device of claim 7, wherein the gap pattern comprises a plurality of lines each extending in a first direction and arranged in a second direction intersecting the first direction.

12. The rollable display device of claim 7, wherein the gap pattern comprises a plurality of dots protruding towards the first module surface from the second window surface.

13. The rollable display device of claim 1, wherein each of the first and second rotary members has a cylindrical shape, the first rotary member has a first radius, and the second rotary member has a second radius greater than the first radius.

14. The rollable display device of claim 1, wherein the first rotary member is disposed between the second rotary member and the slot of the housing, the first rotary member contacts the second module surface to roll up the display module, and the second rotary member contacts the second window surface to roll up the window member.

15. The rollable display device of claim 1, wherein the second rotary member is disposed between the first rotary member and the slot of the housing, the first rotary member contacts the first module surface to roll up the display module, and the second rotary member contacts the first window surface to roll up the window member.

16. The rollable display device of claim 1, wherein each of the first and second rotary members has a cylindrical shape, the first rotary member has a first radius, and the second rotary member has a second radius which is greater than the first radius.

17. The rollable display device of claim 1, wherein each of the first and second rotary members has a cylindrical shape, and a first radius of the first rotary member and a second radius of the second rotary member are equal to each other.

18. A rollable display device comprising:
- a display module including a display panel configured to display an image;
- a window member disposed on the display module to protect the display module;
- a first rotary member on which the display module is configured to be rolled up; and
- a second rotary member spaced from the first rotary member and on which the window member is configured to be rolled up.

19. The rollable display device of claim 18, further comprising a gap pattern disposed between the display module and the window member to maintain a gap between the display module and the window member.

20. The rollable display device of claim 18, wherein the display module further comprises a first elastic layer disposed between the display panel and the window member and a second elastic layer disposed under the display panel.

\* \* \* \* \*